(12) United States Patent
Sota et al.

(10) Patent No.: US 8,436,456 B2
(45) Date of Patent: May 7, 2013

(54) WIRING BOARD, SEMICONDUCTOR DEVICE AND METHOD FOR MANUFACTURING SEMICONDUCTOR DEVICE

(75) Inventors: Yoshiki Sota, Osaka (JP); Kazuaki Tatsumi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 254 days.

(21) Appl. No.: 12/988,697

(22) PCT Filed: Mar. 16, 2009

(86) PCT No.: PCT/JP2009/055065
§ 371 (c)(1),
(2), (4) Date: Oct. 20, 2010

(87) PCT Pub. No.: WO2009/130958
PCT Pub. Date: Oct. 29, 2009

(65) Prior Publication Data
US 2011/0042828 A1    Feb. 24, 2011

(30) Foreign Application Priority Data

Apr. 25, 2008 (JP) .................... 2008-116210

(51) Int. Cl.
*H01L 23/02* (2006.01)
*H01L 21/00* (2006.01)
(52) U.S. Cl.
USPC ............ 257/686; 257/678; 257/E33.056; 257/E23.141; 438/106; 438/108; 438/109
(58) Field of Classification Search .......... 438/106, 438/108, 109; 257/678, 686, E33.056, E23.141
See application file for complete search history.

(56) References Cited

U.S. PATENT DOCUMENTS

| 6,285,086 | B1 | 9/2001 | Sota |
| 6,815,830 | B2 * | 11/2004 | Miyasaka ............... 257/778 |
| 7,402,901 | B2 * | 7/2008 | Hatano et al. ............ 257/684 |
| 2004/0069998 | A1 * | 4/2004 | Harazono ................ 257/81 |

FOREIGN PATENT DOCUMENTS

| JP | 10-233463 A | 9/1998 |
| JP | 2001-015628 | 1/2001 |
| JP | 2003-224233 | 8/2003 |
| JP | 2007-012714 | 1/2007 |

OTHER PUBLICATIONS

International Search Report for PCT/JP2009/055065, mailed Apr. 28, 2009.

\* cited by examiner

*Primary Examiner* — Michelle Mandala
(74) *Attorney, Agent, or Firm* — Nixon & Vanderhye, P.C.

(57) ABSTRACT

A wiring board (10) of the present invention includes: a through hole (11b), provided in a semiconductor chip mounted region (15), penetrating the wiring board (10); and a groove pattern (13), provided on a solder resist (9) formed on the semiconductor chip mounted region (15), leading to the through hole (11b). The foregoing configuration makes it possible to guide, via the groove pattern (13) to the through hole (11b), moisture that collects in the semiconductor chip mounted region (15) and therefore to effectively discharge the moisture from the semiconductor chip mounted region (15). Thus, a semiconductor device (30) that employs the wiring board (10) does not suffer from vaporization and expansion, inside of it, due to heat that is applied at the time of manufacturing the semiconductor device (30) and at the time of mounting the semiconductor device (30) on a mount substrate. It is therefore possible to reduce expansion of the semiconductor device.

10 Claims, 9 Drawing Sheets

⇩ OCCURRENCE OF EXPANSION OF BOARD DUE TO HEAT APPLIED AT THE TIME OF REFLOW

⇩ OCCURRENCE OF EXPANSION OF BOARD DUE TO HEAT APPLIED AT THE TIME OF REFLOW

OCCURRENCE OF EXPANSION IN SECTIONS OTHER THAN SECTION WHERE THROUGH HOLE IS PROVIDED

WIRING BOARD, SEMICONDUCTOR DEVICE AND METHOD FOR MANUFACTURING SEMICONDUCTOR DEVICE

This application is the U.S. national phase of International Application No. PCT/JP2009/055065, filed 16 Mar. 2009, which designated the U.S. and claims priority to Japanese Patent Application No. 2008-116210, filed 24 Apr. 2008, the entire contents of each of which are hereby incorporated by reference.

TECHNICAL FIELD

The present invention relates to: a surface mount semiconductor device in which an external connection terminal is arranged in an area array manner; and a wiring board that is included in the surface mount semiconductor device. Particularly, the present invention relates to: a wiring board that reduces expansion of the semiconductor device caused by vaporization and expansion of moisture that collects within the semiconductor device, which vaporization and expansion are due to heat that is applied at the time of manufacturing the semiconductor device and at the time of mounting the semiconductor device on a mount substrate; a semiconductor device that employs the wiring board; and a method for manufacturing the semiconductor device.

BACKGROUND ART

There have been often used a QFP (Quad Flat Package)-type and a BGA (Ball Grid Allay)-type CSP (Chip Size Package/Chip Scale Package) semiconductor device, so as to (i) meet a recent tendency toward reduction of electronic devices in size and (ii) to conform to automation of an assembly process. Particularly, to meet high-speed and high-performance signal processing of a semiconductor chip in the semiconductor device, a demand for more external connection terminals has been increasing. Therefore, there has been often employed the BGA-type semiconductor device in which the external connection terminals are arranged in two-dimensional manner at the bottom of the semiconductor device.

FIG. 8 shows a cross-sectional configuration of a BGA-type CSP semiconductor device 110, and a lower part of FIG. 8 also shows a defective condition that occurs in the semiconductor device 110 which will be described later.

In the semiconductor device 110, a semiconductor chip 103 is mounted on a semiconductor chip mounted region 102 that is on an upper surface of a wiring board 101, and an electrode pad section of the semiconductor chip 103 is electrically connected to a wire bonding terminal section of the wiring board 101 through a thin metallic wire (wire) 107. Further, the semiconductor chip 103 and the thin metallic wire 107 are sealed with a resin 108 so as to be cover with the resin. Furthermore, a metallic external connection terminal 109 such as a solder ball is provided on a lower surface of the wiring board 101. A package structure of the semiconductor device 110 as described above is a dominating structure of a BGA-type package these days, and is more advantageous in terms of size reduction and electrical properties, as compared to other semiconductor package structures. Therefore, the package structure is often employed in portable electronic devices such as mobile phones and portable video game machines.

In order to form the external connection terminal 109 at the time of manufacturing the above-mentioned semiconductor device 110, the following method is often employed: a solder used for the external connection terminal 109 is melted by a heating device such as a reflow oven. Further, in order to mount the semiconductor device 110 on a mount substrate, the following method is generally employed: solder paste or flux is applied to the mount substrate; the semiconductor device 110 is mounted on the solder paste or the flux; and the solder ball that is the external connection terminal 109 is melted by the heating device. As such, the external connection terminal 109 is connected to the mount substrate.

Regarding the solder ball constituting the external connection terminal 109, a material of the solder ball has been recently shifted from a eutectic solder to an unleaded solder with consideration to the environment. The unleaded solder has a higher melting point than the eutectic solder. Therefore, heating temperature tends to increase in a reflow process at the time of manufacturing the semiconductor device 110 as described above, at the time of mounting the semiconductor device 110 on the mount substrate as described above and the like times. Specifically, the heating temperature tends to increase by the order of 20° C. to 30° C.

In this manner, as the heating temperature increases in the reflow process, the following phenomenon occurs. That is, the heat causes the semiconductor device 110 to suffer from vaporization and expansion of moisture that is absorbed into the semiconductor device 110, thereby causing deformation of an outside shape of the semiconductor device 110. As a result, there occur such problems that (i) the semiconductor device 110 becomes faulty or becomes impossible to be mounted, and (ii) a wire of the semiconductor device 110 is broken (see the lower part of FIG. 8).

More specifically, the above-mentioned semiconductor device 110 is manufactured by mounting a semiconductor chip on a wiring board, subjecting to wire bonding, and sealing the semiconductor chip and the wire with a resin. In such a semiconductor device 110, moisture that is absorbed after assembly of the semiconductor device tends to collect in the vicinity of interfaces between components of the semiconductor device 110, mainly in a contact section between the semiconductor chip and the wiring board. Particularly, a lot of moisture tends to collect in an interface (that is, the semiconductor chip mounted region 102 of the semiconductor device 110) between the semiconductor chip and the wiring board. The moisture is vaporized and expanded by the heat applied in the reflow process. This particularly causes great expansion of the semiconductor chip mounted region of the wiring board. As a result, the above-mentioned problems such as deformation of the outside shape occur. Such problems tend to occur more often in a semiconductor device that employs a thin wiring board.

In order to solve the problems, in a semiconductor device that has a configuration in which a semiconductor chip is bonded to a wiring board by a sheet-like adhesive, the following method is employed to increase adhesiveness of the semiconductor chip to the wiring board: a solder resist is applied in layers to the wiring board so as to reduce influence caused by unevenness of a wiring pattern that is provided under the solder resist. Further, in order to solve the problems, the following method is also employed: a through hole is provided in a part of the semiconductor chip mounted region of the wiring board so that moisture that collects within the semiconductor device can be discharged (see Patent Literature 1).

FIG. 9 shows a cross-sectional configuration of a semiconductor device 110a, which is the semiconductor device 110 which employs the method of providing the through hole so that collected moisture is discharged from the through hole. A lower part of FIG. 9 shows a defective condition (problem)

that occurs in the semiconductor device 110a, which will be described later. As shown in FIG. 9, in the semiconductor device 110a, a through hole 111 is provided in the wiring board 101 of the semiconductor chip mounted region 102 so that the collected moisture is discharged from the through hole 111.

However, in the method of applying the solder resist in layers to the wiring board to reduce the influence caused by the unevenness of the wiring pattern that is provided under the solder resist, a solder resist needs to be applied several times in a process for manufacturing the wiring board. This causes problems such as increase in manufacturing processes and increase in cost of manufacturing. Further, in the method of providing the through hole in a part of the wiring board so that moisture that collects within the semiconductor device can be discharged, it is impossible to discharge all the collected moisture. Therefore, expansion occurs in a region where moisture is left, that is, in a region other than the part where the through hole is provided in the semiconductor chip mounted region.

Patent Literature 1
Japanese Patent Application Publication,
Tokukai No. 2001-15628 A (Publication Date: Jan. 19, 2001)

SUMMARY OF INVENTION

The present invention has been attained to solve the problems, and an object of the present invention is to provide: a wiring board that reduces expansion of a semiconductor device which expansion is caused by vaporization and expansion of moisture that collects within the semiconductor device due to heat that is applied at the time of manufacturing the semiconductor device and at the time of mounting the semiconductor device on a mount substrate; a semiconductor device that employs the wiring board; and a method for manufacturing the semiconductor device.

A wiring board of the present invention, to attain the object, being arranged such that: an external connection terminal is provided on a surface of the wiring board, the surface being opposite to a surface where a semiconductor chip mounted region for mounting at least one semiconductor chip thereon is provided; and that a solder resist is applied onto at least the semiconductor chip mounted region, the wiring board, including: at least one through hole, provided in the semiconductor chip mounted region, penetrating the wiring board; a groove pattern, provided on the solder resist formed in the semiconductor chip mounted region, leading to the through hole; and a metal pattern being provided (i) in a vicinity of the through hole and (ii) on the surface where the semiconductor chip mounted region is provided.

A method for manufacturing a semiconductor device of the present invention, to attain the object, including a wiring board on a surface of which an external connection terminal is provided, the surface being opposite to a surface where a semiconductor chip mounted region for mounting at least one semiconductor chip thereon is provided, including: a through hole forming step of forming, in the semiconductor chip mounted region, at least one through hole that penetrates the wiring board; a metal pattern forming step of forming a metal pattern (i) in a vicinity of the through hole and (ii) on the surface where the semiconductor chip mounted region is provided; a resist applying step of applying a solder resist to the wiring board in and on which the through hole and the metal pattern are formed; a resist removing step of removing the solder resist that is applied to the through hole; and a groove pattern forming step of forming, on the solder resist formed in the semiconductor chip mounted region, a groove pattern that leads to the through hole.

According to the foregoing configuration and method, the wiring board of the present invention includes, in the semiconductor chip mounted region, at least one through hole that penetrates the wiring board. It is therefore possible to discharge, from the semiconductor chip mounted region, moisture that collects within the semiconductor chip mounted region. Further, the wiring board includes, in the solder resist formed in the semiconductor chip mounted region, a groove pattern that leads to the through hole. It is therefore possible to guide the moisture that collects within the semiconductor chip mounted region to the through hole via the groove pattern.

That is, the wiring board can guide the moisture that collects within the semiconductor chip mounted region to the through hole via the groove pattern, and therefore can effectively discharge the moisture from the semiconductor chip mounted region. Thus, the semiconductor device that employs the wiring board does not suffer from vaporization and expansion inside of it due to heat that is applied at the time of manufacturing the semiconductor device and at the time of mounting the semiconductor device on the mount substrate. It is therefore possible to reduce expansion of the semiconductor device. As a result, it is possible to provide the wiring board that reduces the expansion of the semiconductor device and a method for manufacturing the semiconductor device.

A semiconductor device of the present invention, to attain the object, includes a wiring board arranged such that (i) a semiconductor chip is mounted on a semiconductor chip mounted region and (ii) an external connection terminal is provided on a surface of the wiring board, the surface being opposite to a surface where the semiconductor chip mounted region is provided.

REFERENCE SIGNS LIST

6: Dummy Wiring Pattern
8: Wiring Pattern
9: Solder Resist
10, 10a, 10b, 10c and 10d: Wiring Board
11b: Through Hole
12: Groove Pattern
13: Metal Pattern 15: Semiconductor Chip Mounted Region
16: Sheet-Like Adhesive
17: Semiconductor Chip
18: Thin Metallic Wire (Wire)
19: Resin
20: External Connection Terminal
30: Semiconductor Device

DESCRIPTION OF EMBODIMENTS

The following describes an embodiment of the present invention with reference to FIGS. 1 to 7.

Figure 1:
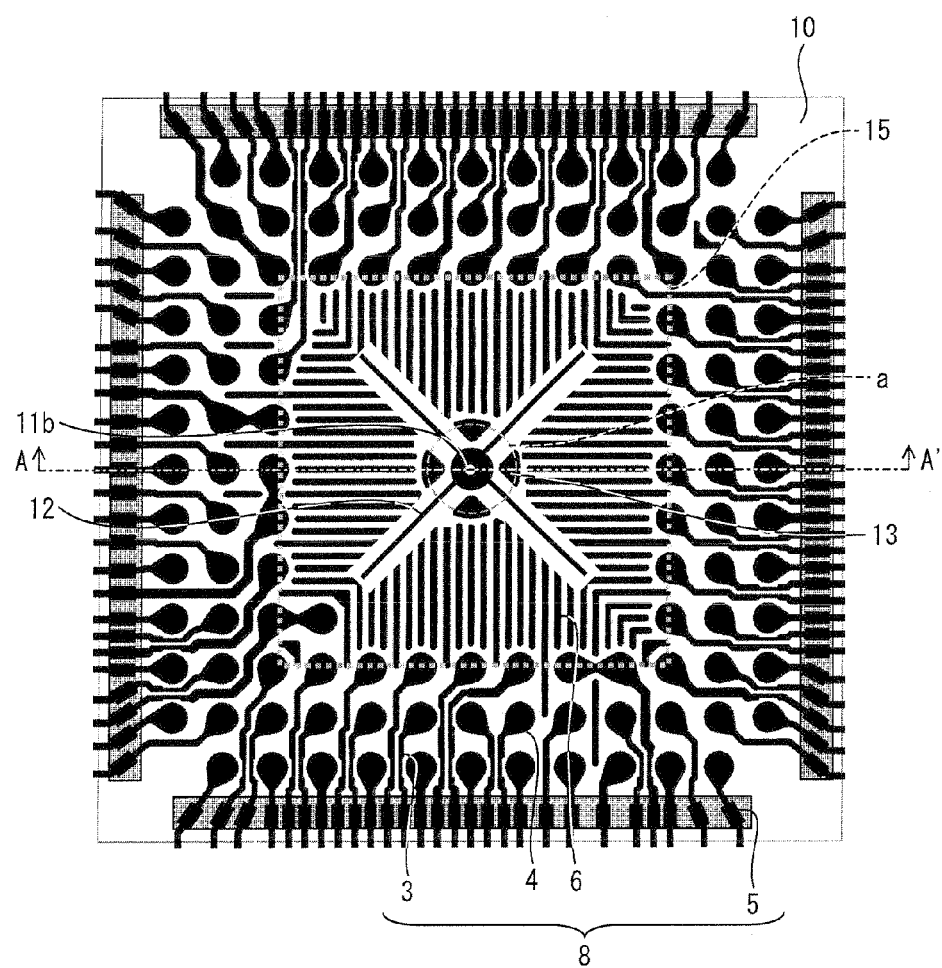
FIG. 1 is a plan view of a wiring board in accordance with an embodiment of the present invention.
Figure 2:
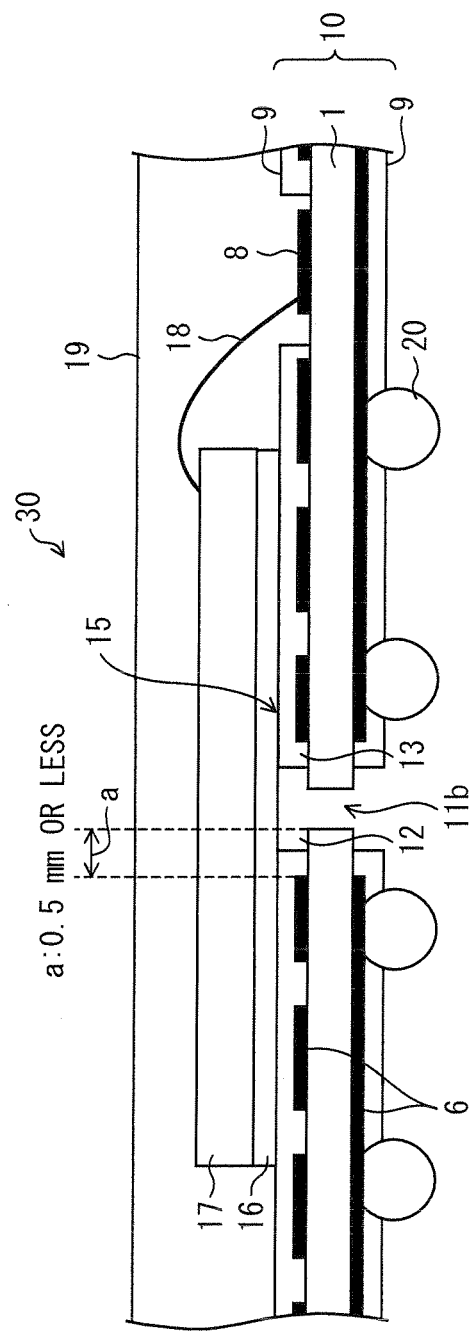
FIG. 2 is a cross sectional view of a semiconductor device that includes the wiring board, shown in FIG. 1, in accordance with an embodiment of the present invention.

FIG. 1 shows a plan view (top view) of the configuration of a wiring board 10 in accordance with the present embodiment. FIG. 2 shows a cross-sectional view of the configuration of a semiconductor device 30 in accordance with the present embodiment. FIG. 2 also shows a cross section taken along A-A' section of FIG. 1.

(Configuration of Semiconductor Device)

As shown in FIG. 2, the semiconductor device 30 is arranged in the following manner. A semiconductor chip 17 is mounted, via a sheet-like adhesive 16, on a semiconductor chip mounted region 15 which is provided in an upper surface of the wiring board 10, and an electrode pad section (not shown) of the semiconductor chip 17 is electrically connected to a wire bonding terminal section (not shown) of the wiring board 10 through a thin metallic wire (wire) 18. Further, the semiconductor chip 17 and the thin metallic wire 18 are sealed with a resin 19 so that they are covered with the resin 19. Furthermore, external connection terminals 20 are provided on a lower surface of the wiring board 10 which lower surface is opposite to the upper surface of the wiring board 10.

A base material 1 of the wiring board 10 is not limited as long as the base material 1 is an insulating material. Examples of the base material 1 include: a core board in which glass fiber is impregnated with an epoxy resin; an epoxy board that is impregnated with polyimide or glass cloth; and an aramid resin board. In the present embodiment, the core board in which the glass fiber is impregnated with the epoxy resin is used. Further, in the present embodiment, a double-sided copper-clad board is used. The double-sided copper-clad board is configured by bonding a copper foil (copper foil 1a) to upper and lower surfaces of the core board. The base material 1 of the wiring board 10 is preferably 0.2 mm or less in thickness so as to meet recent demands for reduction of electronic devices in size and thickness. In the present embodiment, the base material 1 of 0.06 mm in thickness is used. However, the thickness of the base material 1 is not limited to this embodiment, and therefore a base material 1 of 0.04 mm to 0.06 mm in thickness may be used.

The wiring board 10 has wiring patterns 8 formed from the copper foil respectively on the upper and lower surfaces of the base material 1. The wiring pattern 8 is on the order of 10 um to 20 um in thickness. However, the wiring pattern 8 can be thinner or thicker, depending on a density of a wiring pattern. In the present embodiment, the wiring pattern 8 is 15 um in thickness.

Further, the wiring board 10 has through holes 11 which penetrate the wiring board 10 (which reach the upper and lower surfaces of the wiring board 10). The through holes 11 include (i) a through hole 11a (not shown) for ensuring electric connection between the wiring patterns that are provided on the upper and lower surfaces of the wiring board 10 and (ii) a through hole 11b for discharging moisture that collects in an interface (the semiconductor chip mounted region 15) between the wiring board 10 and the semiconductor device 17. An inner surface of the through hole 11a is plated with copper, but an inner surface of the through hole 11b is not plated with copper. It is preferable that each diameter of the through holes 11a and 11b is small. Specifically, the diameter (φ) is preferably 0.2 mm or less. In the present embodiment, the diameter of the through holes 11a and 11b is 0.1 mm. Furthermore, the diameters of the through holes 11a and 11b are preferably identical to each other because the through holes 11a and 11b can be effectively produced. However, it is possible to produce the through holes 11a and 11b even if the diameters of the through holes 11a and 11b are different from each other.

The number of the through hole 11b may be one or more. Note that in a case where a plurality of through holes 11b are provided, it is necessary to provide the through holes 11b so that the through holes 11b do not affect a signal wiring pattern or the like of the wiring pattern 8. Further, a metal pattern (metal pattern 13) is provided (i) in the vicinity of the through hole 11b and (ii) on the upper surface of the wiring board 10. More specifically, the metal pattern is provided in an area within 0.5 mm from an edge of the through hole 11b (in a region "a" of FIG. 2).

Furthermore, an insulating solder resist (solder resist 9) is applied onto the wiring pattern 8 of the wiring board 10, except for (i) the wire bonding terminal section of the wiring pattern 8 which wire bonding terminal section is wire-bonded (connected) to the electrode pad section of the semiconductor chip 17 through the thin metallic wire 18 and (ii) a land section where the external connection terminal 20 is formed. Note that, in a case where the base material 1 of the wiring board 10 ranges from 0.04 mm to 0.06 mm in thickness, the wiring board 10 including the solder resist is around 0.1 mm in thickness.

The sheet-like adhesive 16 is adhered to a surface (backside) of the semiconductor chip 17 opposite to a circuit forming surface of the semiconductor chip 17, and the sheet-like adhesive 16 is used to bond the semiconductor chip 17 to the wiring board 10. It is therefore possible to improve adhesiveness between the semiconductor chip 17 and the wiring board 10 by using the sheet-like adhesive 16 for bonding the semiconductor chip 17 to the wiring board 10.

As described above, in a case where the sheet-like adhesive 16 is adhered to the backside of the semiconductor chip 17, the sheet-like adhesive 16 is adhered to the backside of the semiconductor chip 17 at a stage where the semiconductor chip 17 is in a wafer state, and the wafer is then cut into chips. Alternatively, an adhesive component of a dicing sheet may be transferred to a backside of the wafer. Further, the sheet-like adhesive 16 may be adhered to the semiconductor chip mounted region 15 of the wiring board 10 instead of adhering the sheet-like adhesive 16 to the backside of the semiconductor chip 17.

A thickness of the semiconductor chip 17 is not particularly limited. In the present embodiment, the semiconductor chip 17 of 0.33 mm in thickness is used. The semiconductor chips 17 can be stacked in plural layers in order to respond a recent demand for high-performance of electronic devices. In this case, the semiconductor chip 17 ranges approximately from 70 um to 400 um in thickness though the thickness depends on the number of layers of the semiconductor chips 17, and other factors.

In the present embodiment, the thin metallic wire 18 made of gold or copper is used. It is preferable that a cross-sectional diameter of the thin metallic wire 18 ranges on the order of 20 μm to 30 μm in a case where the thin metallic wire 18 is a gold wire. In the present embodiment, the gold wire whose cross-sectional diameter is 25 μm is used.

It is preferable that the sealing resin 19 is an epoxy-type or a biphenyl-type thermosetting resin. In the present embodiment, the epoxy-type resin is used.

Examples of the external connection terminal 20 include: a solder ball made of only solder; or a solder ball configured such that (i) a metallic ball made of copper or the like or (ii) a resin ball made of a resin is coated with a solder, and that the metallic ball or the resin ball is positioned in the center of the solder ball. In a case where the solder ball including the metallic ball or the like is used, it is possible to keep a clearance between the semiconductor device 30 and a mount substrate so as to be equal to or more than a specific value when the semiconductor device 30 is mounted on the mount substrate. Further, a trend for the solder used as a material for the solder ball has been recently shifted from eutectic solder to unleaded solder, with consideration to the environment. Furthermore, a diameter of the solder ball varies depending on a pitch between the external connection terminals 20, and/or other factors.

(Configuration of Wiring Board)

The following describes a planar configuration of the wiring board 10.

As shown in FIG. 1, the wiring pattern 8 that is provided on the wiring board 10 includes signal wiring patterns 3, 4 and 5 and a dummy wiring pattern 6. The signal wiring pattern 4 is connected to the through hole 11a, the signal wiring pattern 5 is used as the wire bonding terminal section, and the signal wiring pattern 3 connects the signal wiring pattern 4 to the signal wiring pattern 5. Further, an external connection terminal land that is connected to the signal wiring pattern 4 via the through hole 11a is provided on a surface of the wiring board 10 which surface is opposite to a surface where the signal wiring pattern 4 is formed.

The dummy wiring pattern 6 is provided in the semiconductor chip mounted region 15. In the present embodiment, as shown in FIG. 1, the dummy wiring pattern 6 is formed so as to be (i) a pattern in which wirings and spaces are arranged alternately so that the wirings extend from the center of the semiconductor chip mounted region 15 to four sides of a perimeter of the wiring board 10, and (ii) a pattern in which ends of the wirings are not enclosed in the semiconductor chip mounted region 15. Further, the dummy wiring pattern 6 is formed so as to be a pattern in which uniform lines are led out at a wiring density that is identical to a wiring density including a wiring width and a wiring interval (of the signal wiring pattern 3) that are employed in an actual device.

That is, the dummy wiring pattern 6 has such a shape that moisture does not easily collect locally in a region below the semiconductor chip 17, in a case where the semiconductor chip 17 is mounted on the wiring board 10. The dummy wiring pattern 6 is also arranged such that the semiconductor chip 17 is not extremely bonded to the wiring board 10 in some regions. This allows moisture to spread evenly in the semiconductor chip mounted region 15. It is therefore possible to disperse a force reacted by vaporization and expansion of moisture due to heat that is applied at the time of manufacturing the semiconductor device 30 and at the time of mounting the semiconductor device 30 on a mount substrate. As a result, it is possible to prevent the later-described expansion that occurs in a semiconductor device.

As described above, the dummy wiring pattern 6 that is formed in the semiconductor chip mounted region 15 of the wiring board 10 has such a shape that all ends of the wirings included in the dummy wiring pattern 6 are open within the semiconductor chip mounted region 15. Therefore, no enclosed section is formed under the semiconductor chip 17, in a case where the semiconductor chip 17 is provided on the wiring board 10. Moisture collects in the enclosed section; however, the enclosed section is not formed under the semiconductor chip 17. Therefore, moisture does not locally collect in a region between the semiconductor chip 17 and the wiring board 10. It is therefore possible to prevent the expansion of the semiconductor device caused by expansion of the moisture. This is because moisture does not collect, or the moisture is discharged, even if heat is applied. This can prevent the following defective conditions caused by deformation of an outside shape of the semiconductor device: (i) the semiconductor device becomes faulty or becomes impossible to be provided on the mount substrate and (ii) a wire of the semiconductor device is broken.

As shown in FIG. 1, the through hole 11b is provided in the center of the semiconductor chip mounted region 15. Further, a solder resist provided on the upper and lower surfaces of the wiring board 10 is removed in an area within 0.07 mm from an edge of the through hole 11b toward the perimeter of the wiring board 10. In the present embodiment, only one through hole 11b is provided. However, the number of the through hole 11b is not limited to this, and a plurality of through holes 11b may be provided.

Further, on the upper surface side of the wiring board 10, a groove pattern 12 that leads to the through hole 11b is provided in the solder resist that is provided in the semiconductor chip mounted region 15 on the wiring pattern 8. In the present embodiment, four groove patterns 12 are provided with respect to the through hole 11b. The four groove patterns 12 are each linear in shape and are formed so as to be symmetric one another with respect to the through hole 11b. In the present embodiment, the four groove patterns 12 are provided (i) so as to extend toward four directions of the perimeter of the wiring board 10, respectively, and (ii) so as to be shaped like a letter "X" when the upper surface of the wiring board 10 is viewed directly from above. Such a provision of the groove patterns 12 allows the groove patterns 12 to be arranged evenly. This is less likely to cause a state in which stress, which will be described later, is locally applied. In the above descriptions, the groove patterns 12 are provided symmetrically. However, this is not the only possibility. Alternatively, the groove patterns 12 may be provided asymmetrically, and also may be provided in other shapes which will be described later.

Furthermore, it is preferable that each of the groove patterns 12 is on the order of 0.1 mm in width. Note that an optimal value of the width varies depending on a positional relationship between the groove patterns 12 and the wiring pattern 8 and/or other factors. In the present embodiment, each of the groove patterns 12 is 0.07 mm in width. The groove patterns 12 may be completely open (that is, the wiring pattern 8 provided under the groove patterns 12 may be viewed from the groove patterns 12; in other words, the wiring pattern 8 may be exposed from the groove patterns 12), and may have a certain degree of depth without being open. Moreover, the groove patterns 12 are basically provided in a region where the groove patterns 12 do not overlap the wiring pattern 8. However, it is no problem if the groove patterns 12 overlap the wiring pattern 8.

In addition, the metal pattern 13 is provided (i) in the vicinity of the through hole 11b and (ii) on the upper surface of the wiring board 10. Specifically, the metal pattern 13 is provided in an area within 0.5 mm (a region "a" of FIG. 1) from the edge of the through hole 11b toward the perimeter of the wiring board 10. In the present embodiment, the metal pattern 13 is provided in an area of 0.2 mm from the edge of the through hole 11b. The metal pattern 13 also may be provided in a region where the groove patterns 12 are provided, or may be provided in a region other than the region where the groove patterns 12 are provided. In the present embodiment, the metal pattern 13 is provided in the region other than the region where the groove patterns 12 are provided. Note that in a case where (a) the metal pattern 13 is provided in the region where the groove patterns 12 are provided and (b) the groove patterns 12 are completely open, it is preferable, from the viewpoint of reliability, that the metal pattern 13 is plated because the metal pattern 13 is exposed.

As such, thanks to provision of the through hole 11b, it is possible to discharge, from the semiconductor chip mounted region 15, moisture that collects in the semiconductor chip mounted region 15. Further, thanks to provision of the groove patterns 12 as described above, it is possible to guide the moisture via the groove patterns 12 to the through hole 11b. That is, thanks to provision of the through hole 11b and the groove patterns 12, it is possible to guide the moisture to the through hole 11b via the groove patterns 12 and therefore to effectively discharge the moisture from the semiconductor chip mounted region 15. Thus, the semiconductor device 30 that employs the wiring board 10 does not suffer from vaporization and expansion inside the semiconductor device 30 which occurs due to heat that is applied at the time of manufacturing the semiconductor device 30 and at the time of mounting the semiconductor device 30 on the mount substrate. It is therefore possible to reduce expansion of the semiconductor device 30. As a result, it is possible to prevent the following defective conditions caused by deformation of the outside shape of the semiconductor device: (i) the semiconductor device becomes faulty or impossible to be mounted on the mount substrate and (ii) the wire of the semiconductor device is broken.

That is, the wiring board 10 is arranged such that the dummy wiring pattern 6 is provided so as to prevent moisture from locally collecting in the semiconductor chip mounted region 15 (between the semiconductor chip 17 (the sheet-like adhesive 16) and the wiring board 10). The wiring board 10 is also arranged such that the through hole 11b and the groove patterns 12 are provided so as to effectively discharge the moisture even if the moisture unfortunately collects in the semiconductor chip mounted region 15. On this account, the semiconductor device 30 that employs the wiring board 10 can reliably reduce expansion due to heat that is applied at the time of manufacturing the semiconductor device 30 and at the time of mounting the semiconductor device 30 on the mount substrate. It is therefore possible to reliably prevent the following defective conditions caused by deformation of the outside shape of the semiconductor device 30: (i) the semiconductor device 30 becomes faulty or becomes impossible to be mounted on the mount substrate and (ii) the wire of the semiconductor device 30 is broken.

Further, due to the provision of the through hole 11b in the semiconductor chip mounted region 15, pressure applied at the time of sealing with the resin applies stress in a direction toward the lower surface of the wiring board 10 on which the lower surface the external connection terminal 20 is provided, on the semiconductor chip 17 that is mounted on the semiconductor chip mounted region 15. In view of this, the metal pattern 13 is provided (i) in the vicinity of the through hole 11b and (ii) on the upper surface of the wiring board 10, as described above. This increases a force to support the semiconductor chip 17. It is therefore possible to reduce the stress. Furthermore, as described above, the metal pattern 13 is provided in the area within 0.5 mm from the edge of the through hole 11b. That is, the metal pattern 13 is provided at an area extremely close to the through hole 11b. This further increases the force to support the semiconductor chip 17. It is therefore possible to further reduce the stress.

(Modification Examples of Wiring Board)

Figure 3:
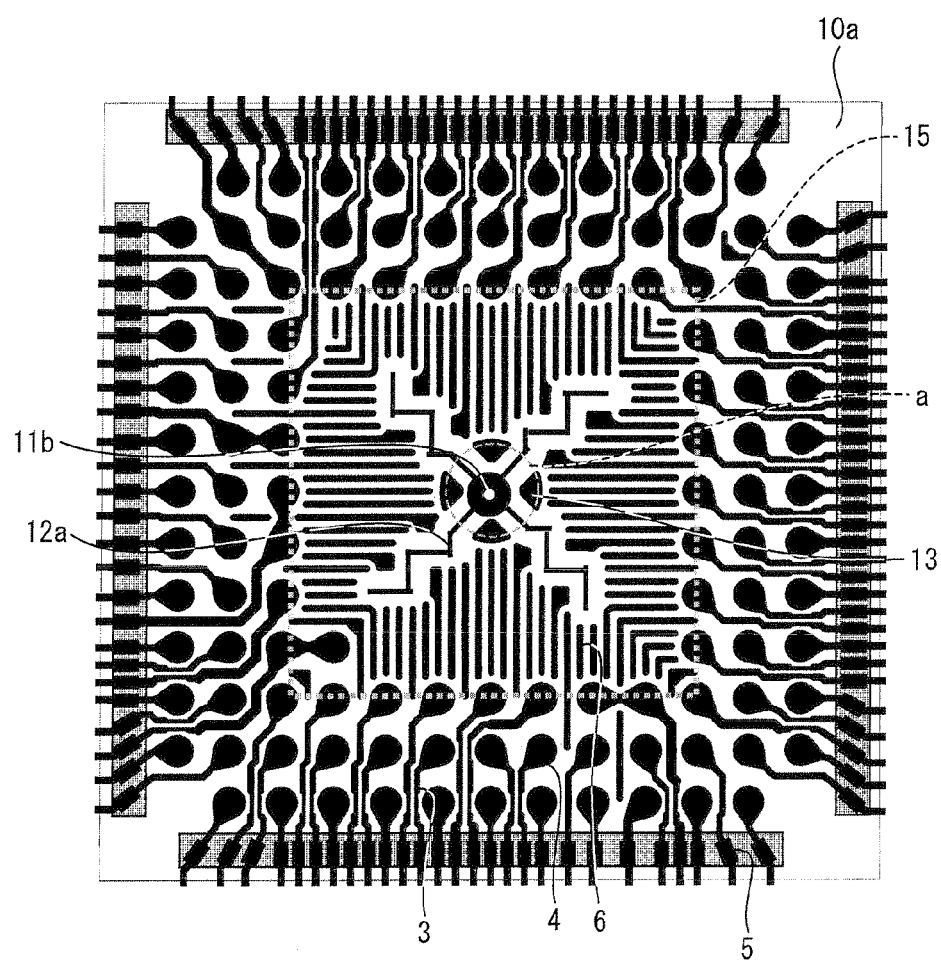
FIG. 3 is a plan view of a wiring board that is a modification example of the wiring board shown in FIG. 1.
Figure 4:
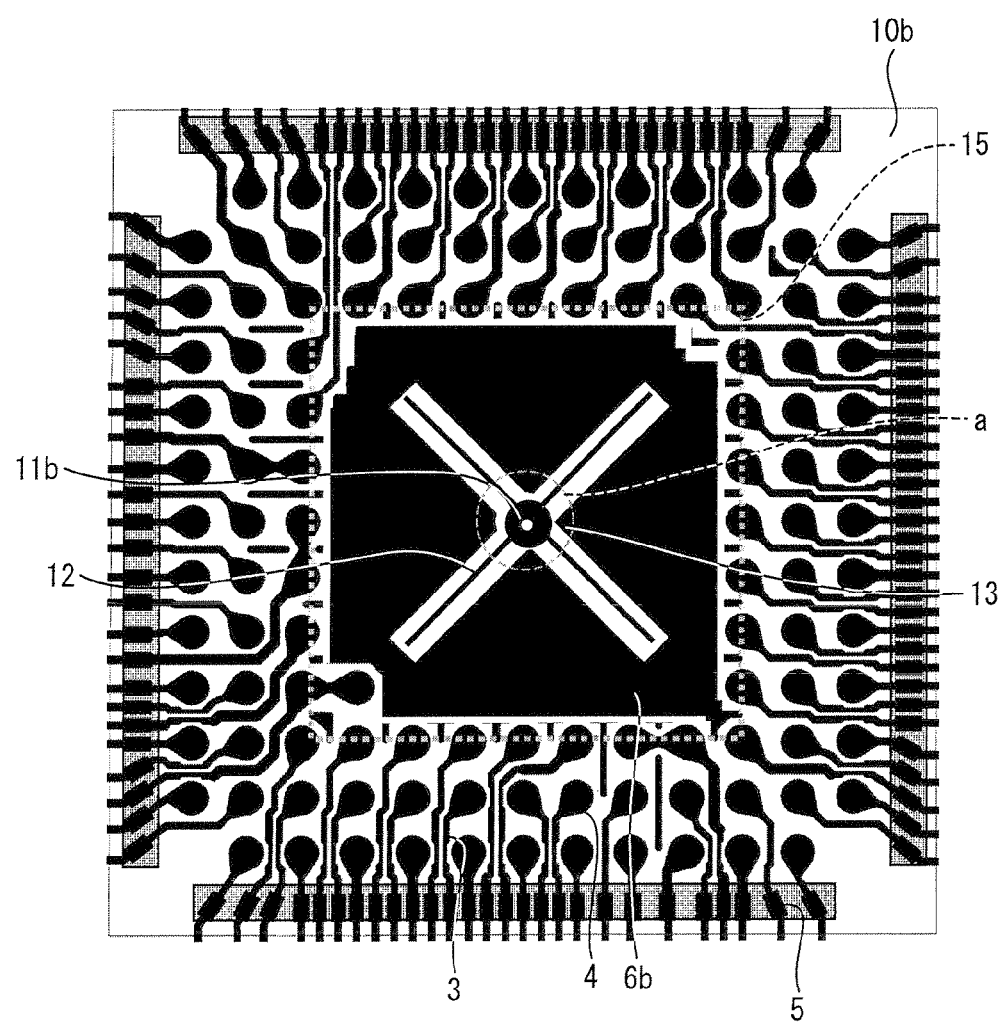
FIG. 4 is a plan view of a wiring board that is another modification example of the wiring board shown in FIG. 1.
Figure 5:
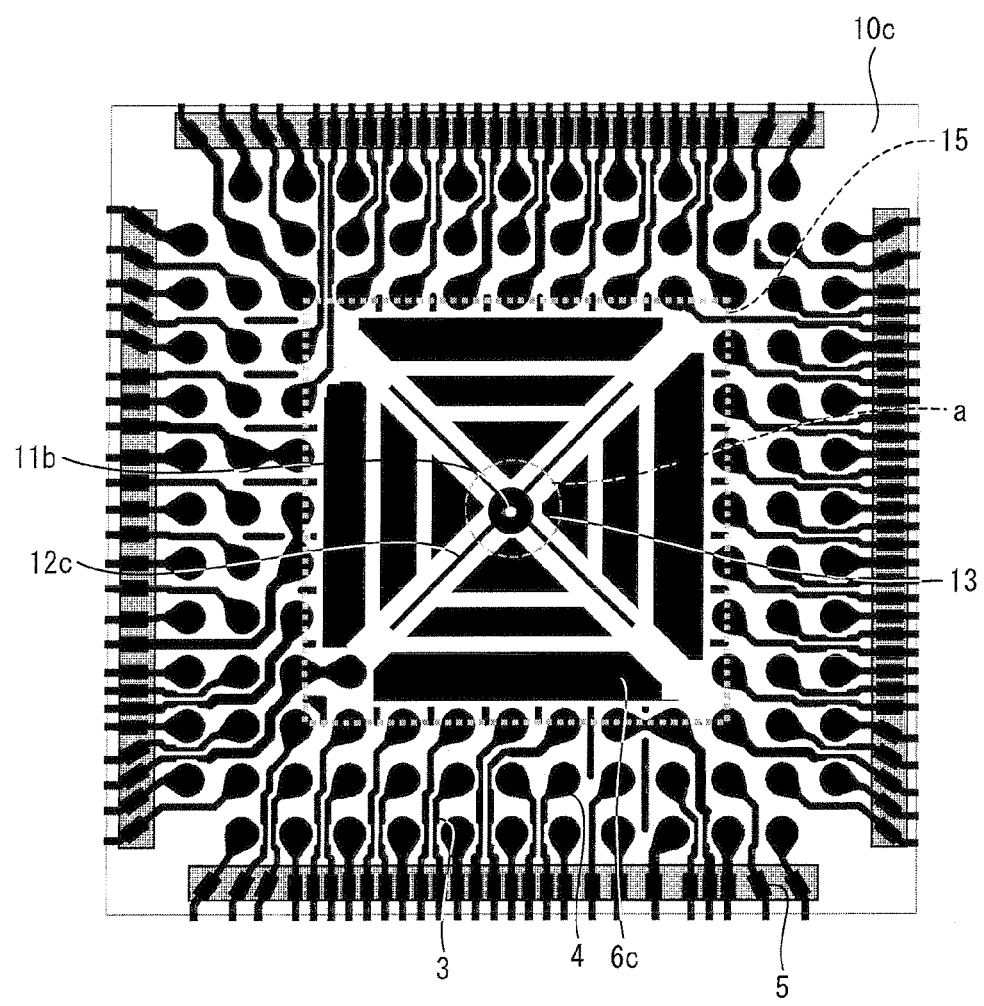
FIG. 5 is a plan view of a wiring board that is yet another modification example of the wiring board shown in FIG. 1.
Figure 6:
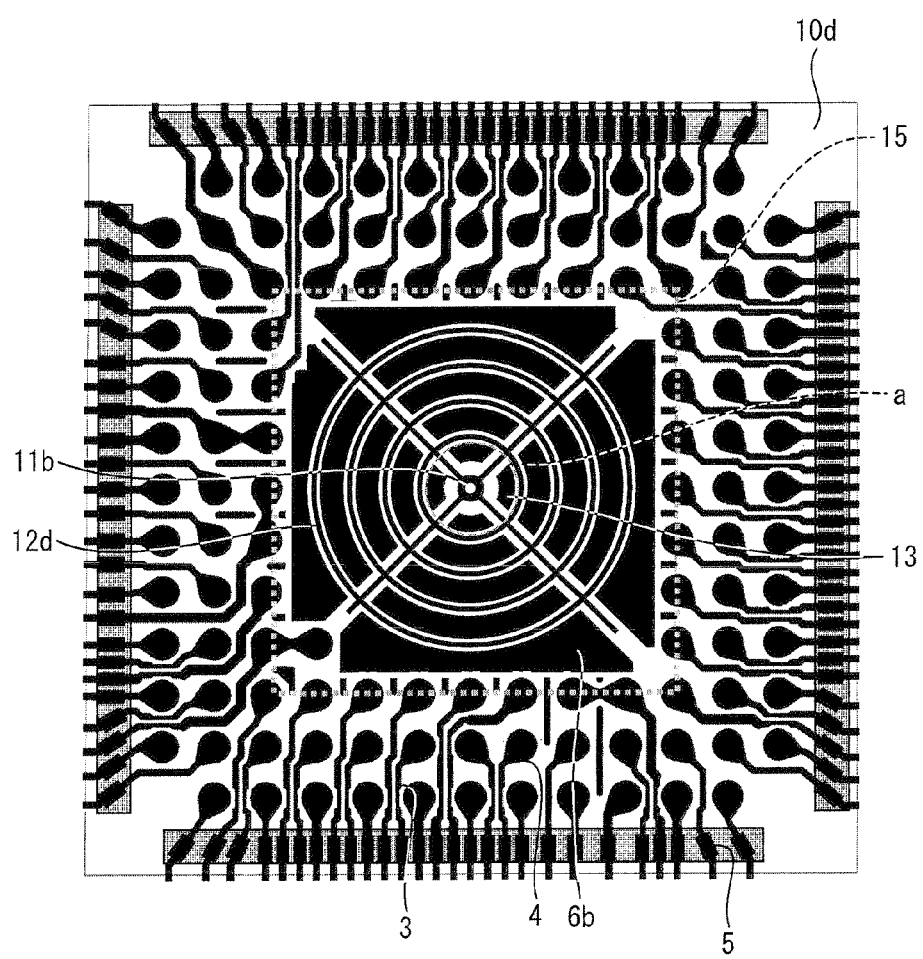
FIG. 6 is a plan view of a wiring board that is further yet another modification example of the wiring board shown in FIG. 1.

A configuration of the wiring board 10 described above is not limited to the foregoing configuration, and may include the following configurations. FIG. 3 shows a planar configuration of a wiring board 10a that is a modification example of the wiring board 10. FIG. 4 shows a planar configuration of a wiring board 10b that is another configuration example of the wiring board 10. FIG. 5 is a planar configuration of a wiring board 10c that is yet another modification example of the wiring board 10. FIG. 6 shows a planar configuration of a wiring board 10d that is further yet another modification example of the wiring board 10. The wiring boards 10a to 10d are obtained by modifying the dummy wiring pattern 6 and/or the groove patterns 12 provided on the wiring board 10. The following describes only modifications for convenience of explanation, and identical reference signs are given to members having identical functions with the members of the wiring board 10, and descriptions of such members are omitted in this embodiment.

As shown in FIG. 3, the wiring board 10a is provided with a jagged groove pattern 12a instead of the linear groove pattern 12. As described above, the groove pattern 12 is not necessarily linear in shape, and may be jagged in shape. Alternatively, the groove pattern 12 may be curved in shape though the curved shape is not shown in FIG. 3.

As shown in FIG. 4, the wiring board 10b is provided with a dummy wiring pattern 6b that is a solid pattern.

As shown in FIG. 5, the wiring board 10c is provided with a groove pattern 12c. The groove pattern 12c is arranged such that an end of the groove pattern 12c opposite to the through hole 11b extends toward an end of the semiconductor chip mounted region 15. Further, the wiring board 10c is provided with a dummy wiring pattern 6c. The dummy wiring pattern 6c is arranged such that the dummy wiring pattern 6b that is a solid pattern has spaces (open pattern) which are shaped like sides of two small and large quadrangles.

As shown in FIG. 6, the wiring board 10d is provided with the dummy wiring pattern 6b that is a solid pattern. The wiring board 10d is also provided with a groove pattern 12d including (i) a groove pattern section (second groove pattern section) whose width is narrower than that of the groove pattern 12c and (ii) a groove pattern section (first groove pattern section) having four (at least one may be provided) large and small concentric circles (having a structure in which spaces corresponding to circumferences of circles are provided), about the through hole 11b positioned in the center of the four concentric circles. The groove pattern 12d is configured by uniting the second groove pattern section with the first groove pattern section at points where the second groove pattern section and the first groove pattern section cross each other.

A configuration of the groove pattern 12 is not limited to the above-described configurations. The configuration of the groove pattern 12 may include a groove pattern (not shown) that extends spirally from the through hole 11b.

(Method for Manufacturing Semiconductor Device)

Figure 7:
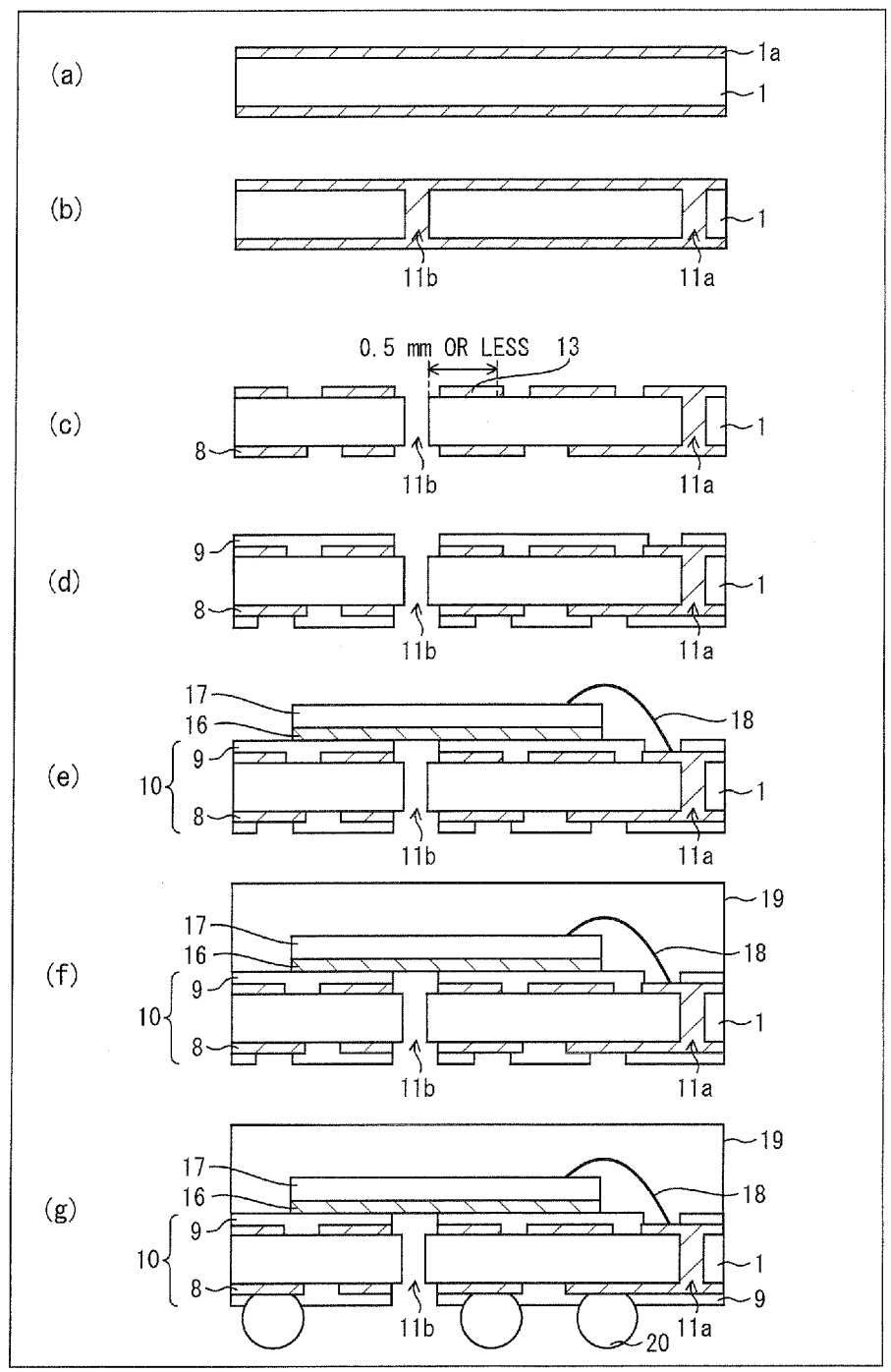
FIG. 7 is a diagram showing a manufacturing process of the semiconductor device shown in FIG. 2.
Figure 8:
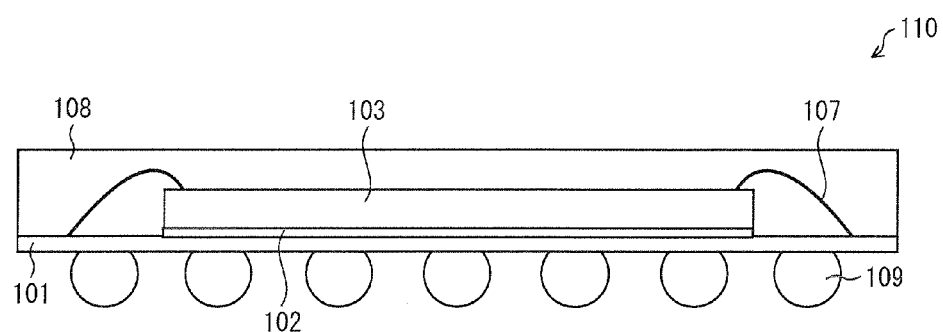
FIG. 8 is a cross sectional view of a conventional semiconductor device.
Figure 8:
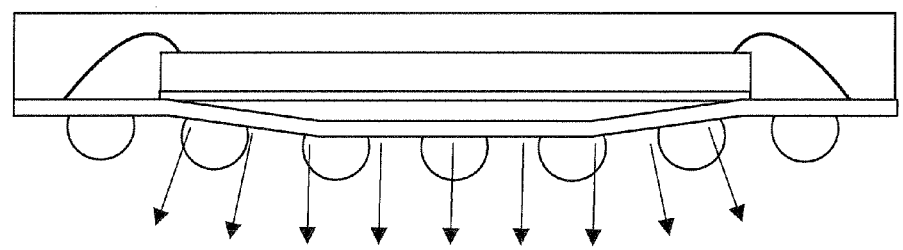
Figure 9:
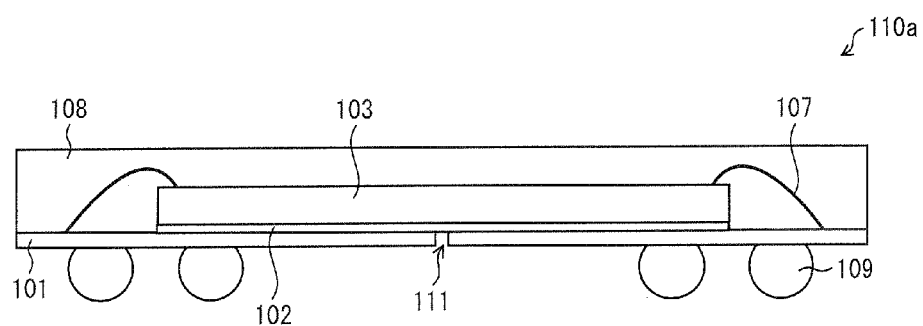
FIG. 9 is a cross sectional view of another conventional semiconductor device.
Figure 9:
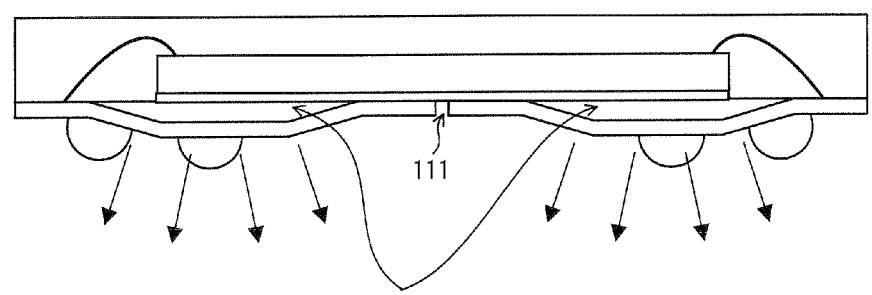

The following describes a method for manufacturing the semiconductor device 30. FIG. 7 shows a manufacturing process of the semiconductor device 30.

First, as shown in (a) of FIG. 7, a base material 1 of the wiring board 10 is prepared. In the present embodiment, as described above, the double-sided copper-clad board, which is 0.06 mm in thickness, is used as the base material 1. The double-sided copper-clad board is configured by adhering a copper foil 1a to upper and lower surfaces of a core board in which glass fiber is impregnated with an epoxy resin.

Secondly, as shown in (b) of FIG. 7, the through holes 11 (through holes 11a and 11b) are formed in the base material 1 by use of a drill or a laser (through hole forming process). In the present embodiment, the through holes 11a and 11b whose diameters are each 0.1 mm are formed by a drill. Then, the formed through holes 11a and 11b are plated with copper. In (b) of FIG. 7, the entire through holes 11 are plated. However, only peripheries of the through holes 11 may be plated as long as wiring patterns provided on upper and lower surfaces of the base material 1 are electrically conductive.

Subsequently, a desired wiring pattern 8 is formed on the upper and lower surfaces of the base material 1 in which the through holes 11 are formed (wiring pattern forming process). The wiring pattern 8 is formed by a known subtractive process. The following briefly describes how to form the wiring pattern 8 by the known subtractive process. First, a dry film for patterning is attached onto the copper foil 1a provided on the upper and lower surfaces of the base material 1, and a pattern of the dry film is then formed by positioning by use of a mask pattern, exposing, and etching the dry film. Secondly, the desired wiring pattern 8 is formed by etching the copper foil 1a provided on the upper and lower surfaces of the base material 1, based on the pattern of the dry film. At the time of forming the wiring pattern 8, a metal formed on an inner surface of the through hole 11b and a metal formed on the periphery of the through hole 11b are removed.

Note that the method for forming the wiring pattern 8 is not limited to the above-described subtractive method. Alternatively, an additive method or a semiadditive method may be adopted. In these methods, a through hole is formed in (i) a board with a thin copper foil formed on upper and lower surfaces of the board or (ii) a board with no copper foil formed thereon. Subsequently, a desired wiring pattern is formed by copper coating, and conductivity inside the through hole is secured. In this case, an inner surface of a through hole 11a is plated, but an inner surface of a through hole 11b is not plated.

Subsequently, as shown in (c) of FIG. 7, the wiring pattern 8 provided (i) in the vicinity of the through hole 11b and (ii) on the upper surface of the wiring board 10 (on the upper surface of the base material 1) is removed. However, in order to form the metal pattern 13, the wiring pattern 8 is left in an area within 0.5 mm (in the present embodiment, in an area of 0.2 mm) from the edge of the through hole 11b is left (metal pattern forming process).

Subsequently, as shown in (d) of FIG. 7, a solder resist 9 is applied to the upper and lower surfaces of the base material 1 on which the through hole 11, the wiring pattern 8, etc. are formed, by a screen printing method or a roll coater method (solder resist applying process). In the present embodiment, the solder resist 9 is formed by the screen printing method. At the time of forming the solder resist 9, the through hole 11a is coated with the solder resist 9 inside of it, in a case where the entire through hole 11a is not plated and only a periphery of the through hole 11a is plated.

Subsequently, the solder resist 9 is reshaped into a desired form by a general lithography method, so that the wire bonding terminal section, the external connection terminal land section, the through hole 11b, and the like sections that need to be exposed from the solder resist 9 are made open (solder resist removing process). In the present embodiment, first, an unnecessary part of the solder resist to be removed is exposed to light for hardening by use of a patterned mask, and the unnecessary part of the solder resist is then removed so that a necessary part of the solder resist to be exposed is made open. At this time, a desired groove pattern 12 is also formed (groove pattern forming process). Subsequently, the open part is plated. Specifically, the open part is plated with nickel, palladium, gold or the like that can be connected by wire bonding.

Subsequently, as shown in (e) of FIG. 7, the semiconductor chip 17 is mounted on the semiconductor chip mounted region 15 of the wiring board 10 by use of the sheet-like adhesive 16 (semiconductor chip mounting process). In the present embodiment, the semiconductor chip 17 of 0.33 mm in thickness is used. Afterward, the electrode pad section of the semiconductor chip 17 is electrically connected to the wire bonding terminal section of the wiring board 10 by wire bonding through use of the thin metallic wire 18 (connecting process). In the present embodiment, the thin metallic wire 18 whose cross-sectional diameter is 25 μm is used.

Subsequently, as shown in (f) of FIG. 7, the semiconductor chip 17 and the thin metallic wire 18 are covered with the resin 19 by a transfer mold method so as to be sealed with the resin 19 (resin sealing process). In the present embodiment, an epoxy-type resin is used as the sealing resin 19.

Subsequently, as shown in (g) of FIG. 7, in the present embodiment, the external connection terminal 20 is formed as follows (external connection terminal forming process): Flux is applied to the external connection terminal land section provided on the lower surface of the wiring board 10, and a solder ball is then arranged on the external connection terminal land section. Afterward, the solder ball is melted under heat of a reflow oven, and the solder ball is then fixed to the wiring board 10. Further, in the present embodiment, an unleaded solder ball is used. Finally, the semiconductor device 30 is completed by separation.

The above-described semiconductor device 30 has a so-called BGA-type package structure. However, the package structure is not limited to this. The semiconductor device of the present invention may have a LGA (Land Grid Array)-type package structure. The configuration of the wiring board in accordance with the present invention is advantageous to a semiconductor device that has such a surface mount package structure, a semiconductor device that is reduced in thickness, and a semiconductor device in which an unleaded solder is used for an external connection terminal with consideration to the environment. Further, in the BGA-type package structure, the external connection terminal is formed by use of a metallic ball such as a solder. However, in the LGA-type package structure, the external connection terminal is not formed by use of the metallic ball such as a solder, but the external connection terminal is formed by applying and melting solder paste or the like so as to be on the order of 0.1 mm or less in thickness, or the external connection terminal is configured by only a metal land of the wiring board without a solder.

Further, the semiconductor device of the present invention may be expressed as the following semiconductor package. That is, the semiconductor device of the present invention may be expressed as a semiconductor package in which (i) a semiconductor chip is provided on an upper surface side of any one of the above-described wiring boards, (ii) the semiconductor chip is brought into conduction with the wiring board through a conductive thin wire, (iii) the semiconductor chip and the conductive thin wire are sealed with a resin so as to be covered with the resin, and (iv) an external connection terminal is provided on a lower surface side of the wiring board.

Furthermore, the semiconductor device of the present invention has the above-described surface mount package structure, and has an advantageous configuration in terms of reduction in size and electrical properties, as compared to other semiconductor packages. Therefore, the semiconductor device of the present invention is suitably applicable to portable electronic devices such as mobile phones and portable video game machines.

It is preferable to arrange the wiring board of the present embodiment such that the metal pattern is provided in an area within 0.5 mm from an edge of the through hole.

In the step of forming the metal pattern of the method for manufacturing the semiconductor device of the present embodiment, it is preferable that the metal pattern is formed in an area within 0.5 mm from an edge of the through hole.

Due to provision of the through hole in the semiconductor chip mounted region, the stress is applied, in the direction toward the surface where the external connection terminal is provided, on the semiconductor chip that is provided on the semiconductor chip mounted region. However, according to the foregoing configuration and method, the metal pattern is provided (i) in the vicinity of the through hole and (ii) on the surface where the semiconductor chip mounted region is provided. This increases a force to support the semiconductor chip. It is therefore possible to reduce the stress.

Further, according to the foregoing configuration and method, the metal pattern is provided in the area within 0.5 mm from the edge of the through hole, that is, the metal pattern is provided at an area extremely close to the through hole. This further increases the force to support the semiconductor chip. It is therefore possible to further reduce the stress.

It is preferable to arrange the wiring board of the present embodiment such that the groove pattern is one of a plurality groove patterns provided with respect to the one through hole, and the plurality of groove patterns are formed so as to be symmetric with respect to the through hole.

According to the foregoing configuration, it is possible to arrange the plurality of groove patterns evenly. This reduces its tendency that the stress is locally applied.

It is preferable to arrange the wiring board of the present embodiment such that the groove pattern is one of a plurality of groove patterns provided with respect to the one through hole, and the plurality of groove patterns are: a first groove pattern section having a circle shape about the through hole positioned in the center of the first groove pattern section; and a second groove pattern section that connects the first groove pattern section to the through hole.

It is preferable to arrange the wiring board of the present embodiment such that the groove pattern is formed so as to extend spirally from the through hole.

It is preferable to arrange the wiring board of the present embodiment such that the groove pattern is linear, jagged or curved in shape.

It is preferable to arrange the wiring board of the present embodiment such that a dummy wiring pattern having such a shape that an end of a wiring pattern included in the dummy wiring pattern is open in the semiconductor chip mounted region is provided in the semiconductor chip mounted region.

It is preferable that the method for manufacturing the semiconductor device of the present embodiment further includes a wiring pattern forming step of forming, on the wiring board, a desired wiring pattern including a dummy wiring pattern in which an end of the wiring pattern is open in the semiconductor chip mounted region, the resist applying step following the wiring pattern forming step.

According to the foregoing configuration and method, the dummy wiring pattern formed in the semiconductor chip mounted region is arranged so that the end of the wiring pattern included in the dummy wiring pattern is open in the semiconductor chip mounted region. This does not form the enclosed section under the semiconductor chip in a case where the semiconductor chip is provided. The enclosed section in which moisture is collected is not formed, so that moisture does not collect locally in the region between the semiconductor chip and the wiring board. It is therefore possible to prevent the semiconductor device from suffering from defective conditions caused by expansion of the moisture even if heat is applied. As such, thanks to the provision of the dummy wiring pattern having the aforementioned shape, it is possible to prevent the semiconductor device from suffering from the defective conditions caused by the expansion of the moisture, with use of a simple configuration without increase in cost. Specifically, it is possible to prevent the following defective conditions caused by deformation of the outside shape of the semiconductor device: (i) the semiconductor device becomes faulty or becomes impossible to be mounted on the mount substrate and (ii) the wire of the semiconductor device is broken. It is therefore possible to manufacture a reliable, high-quality semiconductor device by use of the above-configured wiring board. Further, it is possible to more reliably prevent the defective conditions caused by the expansion of the moisture if all ends of the wiring patterns included in the dummy wiring pattern that is provided in the semiconductor chip mounted region are open in the semiconductor chip mounted region.

Further, the wiring board is provided with the dummy wiring pattern so as to prevent moisture from locally collecting in the semiconductor chip mounted region, and is also provided with through hole and the groove patterns so as to effectively discharge moisture even if the moisture unfortunately collects in the semiconductor chip mounted region. The semiconductor device that employs the wiring board therefore can reliably reduce expansion due to heat that is applied at the time of manufacturing the semiconductor device and at the time of mounting the semiconductor device on the mount substrate. As a result, it is possible to reliably prevent the following defective conditions caused by deformation of the outside shape of the semiconductor device: (i) the semiconductor device becomes faulty or becomes impossible to be mounted on the mount substrate and (ii) the wire of the semiconductor device is broken.

It is preferable to arrange the semiconductor device of the present embodiment such that the semiconductor chip is provided on the wiring board with use of a sheet-like adhesive; the semiconductor chip is electrically connected to the wiring board through a conductive thin metallic wire; the semiconductor chip and the thin metallic wire are sealed with a resin so as to be covered with the resin.

It is preferable that the method for manufacturing the semiconductor device of the present embodiment further includes a semiconductor chip mounting step of mounting a semiconductor chip in the semiconductor chip mounted region of the wiring board with use of a sheet-like adhesive; a connecting step of establishing electric connection between the semiconductor chip and the wiring board through a conductive thin metallic wire; a resin sealing step of sealing the semiconductor chip and the thin metallic wire with a resin so that the semiconductor chip and the thin metallic wire are covered with the resin; and an external connection terminal forming step of forming an external connection terminal on a surface of the wiring board, the surface being opposite to a surface where the semiconductor chip mounted region is provided.

According to the foregoing configuration and method, the semiconductor device of the present invention includes the wiring board that can guide moisture that collects in the semiconductor chip mounted region to the through hole via the groove pattern, and therefore can effectively discharge the moisture from the semiconductor chip mounted region. This does not cause vaporization and expansion inside the semiconductor device due to heat that is applied at the time of manufacturing the semiconductor device and at the time of mounting the semiconductor device on the mount substrate. It is therefore possible to reduce expansion of the semiconductor device. As a result, it is possible to provide the semiconductor device that reduces expansion of the semiconductor device.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is applicable to a semiconductor device that is provided or included in an electronic device or the like, and particularly applicable to a semiconductor device having a surface mount package structure, a semiconductor device that is reduced in thickness and a semiconductor device in which an unleaded solder is used for an external connection terminal with consideration to the environment.

The invention claimed is:

1. A wiring board being arranged such that: an external connection terminal is provided on a surface of the wiring board, the surface being opposite to a surface where a semiconductor chip mounted region for mounting at least one semiconductor chip thereon is provided; and that a solder resist is applied onto at least the semiconductor chip mounted region,
the wiring board, comprising:
at least one through hole, provided in the semiconductor chip mounted region, penetrating the wiring board;
a groove pattern, provided on the solder resist formed in the semiconductor chip mounted region, leading to the through hole, the groove pattern being formed so as to extend outwardly from the through hole;
a metal pattern being provided (i) in a vicinity of the through hole and (ii) on the surface where the semiconductor chip mounted region is provided; and
a dummy wiring pattern having such a shape that an end of a wiring pattern included in the dummy wiring pattern is open in the semiconductor chip mounted region is provided in the semiconductor chip mounted region.

2. The wiring board as set forth in claim 1, wherein:
the metal pattern is provided in an area within 0.5 mm from an edge of the through hole.

3. The wiring board as set forth in claim 1, wherein:
the groove pattern is one of a plurality groove patterns provided with respect to the one through hole, and the plurality of groove patterns are formed so as to be symmetric with respect to the through hole.

4. The wiring board as set forth in claim 1, wherein:
the groove pattern is one of a plurality of groove patterns provided with respect to the one through hole, and
the plurality of groove patterns are: a first groove pattern section having a circle shape about the through hole positioned in the center of the first groove pattern section; and a second groove pattern section that connects the first groove pattern section to the through hole.

5. The wiring board as set forth in claim 1, wherein:
the groove pattern is formed so as to extend spirally from the through hole.

6. The wiring board as set forth in claim 1, wherein:
the groove pattern is linear, jagged or curved in shape.

7. A semiconductor device, comprising a wiring board wherein:
the wiring board is arranged such that an external connection terminal is provided on a surface of the wiring board, the surface being opposite to a surface where a semiconductor chip mounted region for mounting at least one semiconductor chip thereon is provided, and that a solder resist is applied onto at least the semiconductor chip mounted region,
the wiring board comprising:
at least one through hole, provided in the semiconductor chip mounted region, penetrating the wiring board;
a groove pattern, provided on the solder resist formed in the semiconductor chip mounted region, leading to the through hole, the groove pattern being formed so as to linearly extend outwardly from the through hole;
a metal pattern being provided (i) in a vicinity of the through hole and (ii) on the surface where the semiconductor chip mounted region is provided; and
a dummy wiring pattern having such a shape that an end of a wiring pattern included in the dummy wiring pattern is open in the semiconductor chip mounted region being provided in the semiconductor chip mounted region.

8. The semiconductor device as set forth in claim 7, wherein:
the semiconductor chip is provided on the wiring board with use of an adhesive in a sheet form;
the semiconductor chip is electrically connected to the wiring board through a conductive thin metallic wire;
the semiconductor chip and the thin metallic wire are sealed with a resin so as to be covered with the resin; and
the external connection terminal is provided on a surface of the wiring board, the surface being opposite to a surface where the semiconductor chip mounted region is provided.

9. A method for manufacturing a semiconductor device including a wiring board on a surface of which an external connection terminal is provided, the surface being opposite to a surface where a semiconductor chip mounted region for mounting at least one semiconductor chip thereon is provided, comprising:
a through hole forming step of forming, in the semiconductor chip mounted region, at least one through hole that penetrates the wiring board;
a metal pattern forming step of forming a metal pattern (i) in a vicinity of the through hole and (ii) on the surface where the semiconductor chip mounted region is provided, the metal pattern being formed in an area within 0.5 mm from an edge of the through hole;
a resist applying step of applying a solder resist to the wiring board in and on which the through hole and the metal pattern are formed;
a resist removing step of removing the solder resist that is applied to the through hole;
a groove pattern forming step of forming, on the solder resist formed in the semiconductor chip mounted region, a groove pattern that leads to the through hole, the groove pattern being formed so as to extend outwardly from the through hole; and
a wiring pattern forming step of forming, on the wiring board, a desired wiring pattern including a dummy wiring pattern in which an end of the wiring pattern is open in the semiconductor chip mounted region, the resist applying step following the wiring pattern forming step.

10. The method as set forth in claim 9, further comprising:
- a semiconductor chip mounting step of mounting a semiconductor chip in the semiconductor chip mounted region of the wiring board with use of an adhesive in a sheet form;
- a connecting step of establishing electric connection between the semiconductor chip and the wiring board through a conductive thin metallic wire;
- a resin sealing step of sealing the semiconductor chip and the thin metallic wire with a resin so that the semiconductor chip and the thin metallic wire are covered with the resin; and
- an external connection terminal forming step of forming an external connection terminal on a surface of the wiring board, the surface being opposite to a surface where the semiconductor chip mounted region is provided.

* * * * *